(12) United States Patent
Zhu et al.

(10) Patent No.: US 8,084,897 B2
(45) Date of Patent: Dec. 27, 2011

(54) MICRO STAGE WITH 6 DEGREES OF FREEDOM

(75) Inventors: Yu Zhu, Beijing (CN); Jinsong Wang, Beijing (CN); Ming Zhang, Beijing (CN); Guang Li, Beijing (CN); Dengfeng Xu, Beijing (CN); Wensheng Yin, Beijing (CN); Guanghong Duan, Beijing (CN); Kaiming Yang, Beijing (CN)

(73) Assignee: Tsinghua University, Beijing (CN)

( * ) Notice: Subject to any disclaimer, the term of this patent is extended or adjusted under 35 U.S.C. 154(b) by 58 days.

(21) Appl. No.: 12/666,055

(22) PCT Filed: Mar. 14, 2008

(86) PCT No.: PCT/CN2008/000503
§ 371 (c)(1),
(2), (4) Date: Dec. 22, 2009

(87) PCT Pub. No.: WO2009/003348
PCT Pub. Date: Jan. 8, 2009

(65) Prior Publication Data
US 2010/0187917 A1 Jul. 29, 2010

(30) Foreign Application Priority Data
Jun. 29, 2007 (CN) .............................. 200710118130

(51) Int. Cl.
*H02K 41/02* (2006.01)
(52) U.S. Cl. ............... 310/12.06; 310/12.03; 310/12.14; 310/12.19

(58) Field of Classification Search ............... 310/12.03, 310/12.06, 12.14, 12.19
See application file for complete search history.

(56) References Cited

U.S. PATENT DOCUMENTS

| 6,069,416 A | 5/2000 | Chitayat | |
|---|---|---|---|
| 2005/0168076 A1* | 8/2005 | Hazelton | 310/12 |
| 2006/0061218 A1 | 3/2006 | Hazelton | |

FOREIGN PATENT DOCUMENTS

| CN | 1669744 A | 9/2005 |
|---|---|---|
| CN | 101078889 A | 11/2007 |
| EP | 0342639 | 11/1989 |

OTHER PUBLICATIONS

International Search Report dated Jun. 19, 2008.

* cited by examiner

*Primary Examiner* — Quyen Leung
*Assistant Examiner* — Jose Gonzalez Quinones
(74) *Attorney, Agent, or Firm* — RatnerPrestia

(57) ABSTRACT

A micro stage with 6 degrees of freedom used in super-precise processing and sensing equipment fields is disclosed. The micro stage has three sets of electromagnetic driving units arranged in a horizontal plane for driving the micro stage to obtain movements within the horizontal plane with 3 degrees of freedom in X, Y and $\theta_z$ directions and three electromagnetic driving units arranged in a vertical direction for driving the micro stage to obtain additional movements with 3 degrees of freedom in Z, $\theta_x$ and $\theta_y$ directions. Direct driving by electromagnetic force is used in the invention. The invention is also applicable in super-precise processing and sensing fields for achieving 6 degree-of-freedom motions. The micro stage, which operates on the basis of Lorentz Law, provides a linear relation between the output pushing force and the input electrical current.

1 Claim, 4 Drawing Sheets

MICRO STAGE WITH 6 DEGREES OF FREEDOM

This application claims priority of PCT International Application No. PCT/CN2008/000503 filed on Mar. 14, 2008. The contents of which are incorporated herein by reference.

TECHNICAL FIELD

The invention relates to the super-precise processing and sensing equipment field and more particular to a micro stage, especially a micro stage with 6 degrees of freedom, which is mainly used in semiconductor lithographic equipment.

BACKGROUND ART

Micro stages having high precision and rapid responding ability are of great importance in modern manufacture technology and reflect the high-tech level of technical development of a country. In a super-precise machine tool, a super-precise micro stage is used for compensating the error of a feeding system, for achieving super-precise processing. In large scale integrated circuit manufacturing, super-precise micro stages are used in lithographic equipments for achieving micro positioning and micro feeding. In scanning microscopes, super-precise micro stages are used for detecting sample surface profile and nano processing. In biotechnology, super-precise micro stages are used in cell treatments, for achieving industrialized bio treatments. In medical field, super-precise micro stages are used in micro surgeries for alleviating operation labor, shortening operation time and increasing success rate. In addition, super-precise micro stages are also generally used in optical fiber joining, in processing, packaging and assembling of MEMS, in chemical-electrical processing, and the like.

In semiconductor lithographic equipment, it is known that a lithographic machine comprises a wafer table and a mask table each generally comprising a stacked structure of rough-precise stages, in which a super-precise micro stage is superimposed on a rough stage for compensating the precision of the rough stage. The exposure precision of the lithographic machine is mainly determined by the positioning precision of the micro stage, and the production efficiency of the lithographic machine is mainly determined by its movement velocity. Thus, super-precise micro stage technique is regarded as a key factor of lithographic machines in the United States, Japan, European and other developed countries, while China is facing severe restriction to importation of correlated products.

For summarization of current study on nano-level micro stages in China, three types of super-precise micro stage are generally mentioned, i.e., micro stages driven by servo motors via screws and supported by linear guides, micro stages driven by piezo ceramics and supported and guided by flexible hinges, and micro stages driven by voice coil motors or variable reluctance motors and supported by air-floating or magnetic floating means.

The former two types of micro stages, under the negative influence of non-linearity of frictional damping of their supporting systems and other factors, cannot meet the requirements of high velocity, high load and high dynamic performance of lithographic equipments. Micro stages, driven by voice coil motors and supported by air-floating means, although meet the requirements of lithographic equipments, suffer from poor structural integrity, bulky stage body, high weight center, etc., which result in various limitations to their performances.

The same applicant of the invention filed a Chinese patent application No. 200610169826.6, titled by "Ultra Thin Planar Motor with 3 Degrees of Freedom", on Dec. 29, 2006 and a Chinese patent application No. 200710098790.1, titled by "Ultra Thin Micro Stage with 3 Degrees of Freedom", on Apr. 27, 2007. The former application discloses an ultra thin structure of a single layer of coil, for avoiding various problems, such as poor structural integrity, found in prior art in which three degrees of freedom are achieved by multiple linear motors, while the later application discloses a 3 degree-of-freedom micro stage for a mask table of a lithographic machine, which uses air floating or magnetic floating bearings. On the basis of the above two applications, the present invention is aimed at providing a 6 degree-of-freedom micro stage which can be used in a wafer table of a lithographic machine, which micro stage is able to compensate the positioning error of the wafer table of the lithographic machine and to achieve the leveling and focusing of the lithographic machine.

SUMMARY OF THE INVENTION

An object of the invention is to provide a 6 degree-of-freedom micro stage which can be used in a wafer table of a lithographic machine, which micro stage is able to compensate the positioning error of the wafer table of the lithographic machine and to achieve the leveling and focusing of the lithographic machine, and is applicable in super-precise processing and sensing fields for obtaining motions with 6 degrees of freedom. Meanwhile, the micro stage is expected to be featured as having a simple structure, a compact profile, a low driven weight center, low stator inertia, etc.

The above object can be achieved by a micro stage with 6 degrees of freedom, comprising a micro stage stator, a micro stage mover and a micro stage base, the micro stage having three sets of electromagnetic driving units arranged in a horizontal plane, with each set comprising at least one electromagnetic driving unit, wherein the driving axes of two of the three sets of driving units are parallel to each other but not coincided, the driving axis of the third set of driving unit is orthogonal to the driving axes of the former two sets of driving units, and the three sets of driving units are configured to cooperatively obtain movements of the micro stage within the horizontal plane with 3 degrees of freedom in X, Y and $\theta_z$ directions, characterized in that the micro stage further has three electromagnetic driving units arranged in a vertical direction and disposed in a triangular layout, for driving the micro stage to obtain additional movements with 3 degrees of freedom in Z, $\theta_x$ and $\theta_y$ directions.

In a preferred embodiment of the invention, each of the horizontally arranged driving units is composed of two parts, i.e., a planar permanent magnet polarized in the vertical direction and a coil, with the planar permanent magnet being disposed along opposite sides of the effective driving direction of the coil and fixed in the micro stage mover, and the coil being nested in a single-layered coil frame and thereby fixed to the micro stage stator; and each of the vertically arranged electromagnetic driving units is composed of a cylindrical permanent magnet polarized in radial directions and a coil, with the cylindrical permanent magnet being fixed in the micro stage mover and the coil being fixed to the micro stage stator.

The micro stage of invention is benefited from adopting a parallel structure for achieving 6 degree-of-freedom motions and is advantageous over stacked structures by having a simple structure, a compact profile, a low driven weight center, low stator inertia, etc. Further, direct driving by electromagnetic force is used in the invention, as a result of which, there is no mechanical friction and damping, and high displacement resolution can be provided. The positioning error of the wafer table of the lithographic machine can be compensated and the leveling and focusing of the lithographic machine can be achieved. The micro stage, which operates on the basis of Lorentz Law, provides a linear relation between the output pushing force and the input electrical current, and thus the movement control technique for it can be well established.

LIST OF PARTS SHOWN IN THE DRAWINGS

1—micro stage base
2—micro stage stator
3—micro stage mover
11—first horizontally arranged driving unit
12—second horizontally arranged driving unit
13—third horizontally arranged driving unit
14—fourth horizontally arranged driving unit
21—first vertically arranged driving unit
22—second vertically arranged driving unit
23—third vertically arranged driving unit
30—coil frames arranged in a horizontal plane
40—coil frames arranged in a vertical direction

DETAILED DESCRIPTION OF PREFERRED EMBODIMENTS

Figure 1:
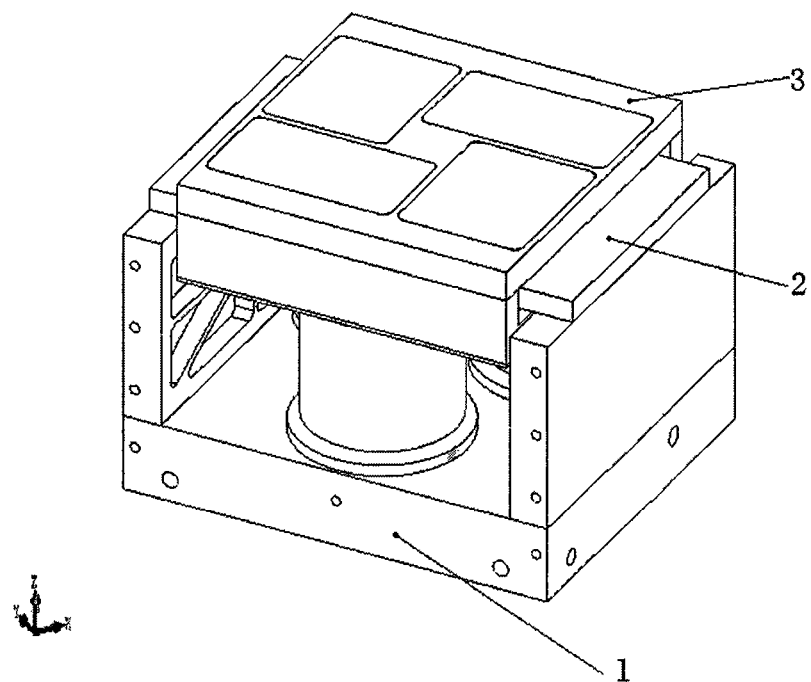
FIG. 1 is a perspective structural view of a 6 degree-of-freedom micro stage according to an embodiment of the invention.

FIG. 1 is a perspective structural view of a 6 degree-of-freedom micro stage according to an embodiment of the invention. The micro stage comprises a micro stage base 1, a micro stage stator 2 and a micro stage mover 3. The micro stage has three sets of electromagnetic driving units arranged in a horizontal plane, wherein the driving axes of two of the three sets of driving units are parallel to each other but not coincided, and the driving axis of the third set of driving units is orthogonal to the driving axes of the former two sets of driving units. The three sets of horizontally arranged driving units are configured to cooperatively obtain movements of the micro stage within the horizontal plane with 3 degrees of freedom in X, Y and $\theta_z$ directions. Each set comprises at least one electromagnetic driving unit, and each electromagnetic driving unit is composed of two parts, i.e., a planar permanent magnet polarized in a vertical direction and a coil, with the planar permanent magnet being disposed along opposite sides of the effective driving direction of the coil and fixed in the micro stage mover 3. Each of the coils is nested in a corresponding single-layered coil frame 30 and is thereby fixed to the micro stage stator 2. The micro stage further has three electromagnetic driving units arranged in the vertical direction and disposed in a triangular layout, and each electromagnetic driving unit is composed of two parts, i.e., a coil and a cylindrical permanent magnet, with each coil being fixed to a corresponding coil frame 40. The three vertically arranged electromagnetic driving units are configured to drive the micro stage to obtain additional movements with 3 degrees of freedom in Z, $\theta_x$ and $\theta_y$ directions.

Figure 2:
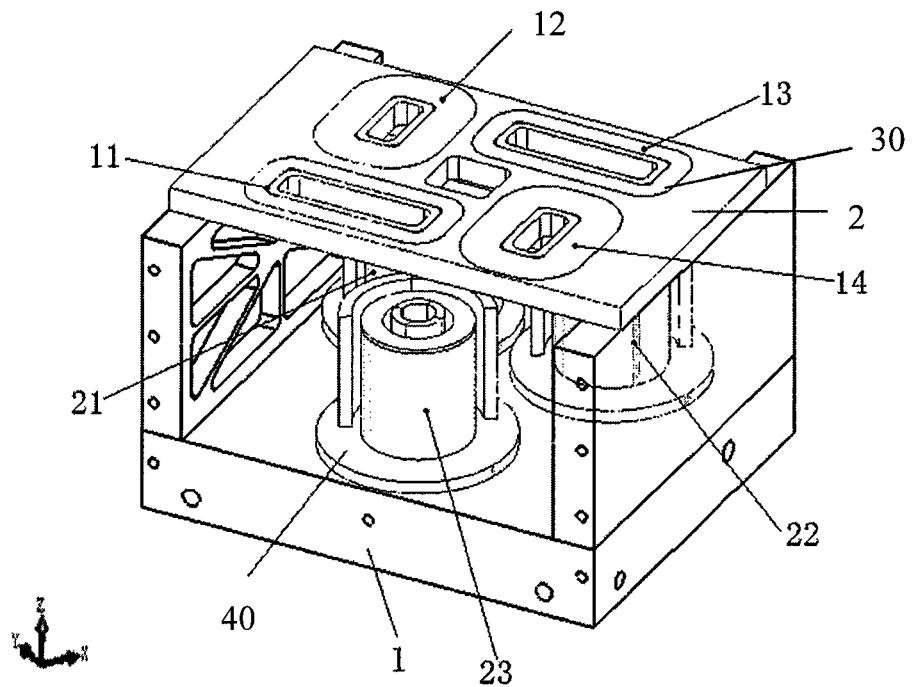
FIG. 2 is a perspective structural view showing the arrangement of driving units of the 6 degree-of-freedom micro stage.

As shown in FIG. 2, the micro stage base 1 may have a U-shaped structure for supporting the micro stage stator 2. The micro stage stator 2 carries the coils of the horizontally arranged electromagnetic driving units, the horizontally arranged coil frames 30, the coils of the vertically arranged driving units, and the vertically arranged coil frames 40. The horizontally arranged coil frames 30 and the vertically arranged coil frames 40 are all fixedly connected with respect to the micro stage base 1. The micro stage mover 3 carries the planar permanent magnets of the horizontally arranged driving units, the cylindrical permanent magnets of the vertically arranged driving units, and supporting members for them. The planar permanent magnets of the horizontally arranged driving units are nested in the mover and are each disposed along the sides of the effective driving direction of the coil of a corresponding driving unit so as to generate a magnetic field which passes through the coil in the vertical direction. The permanent magnets of the vertically arranged driving units each have a cylindrical shape for generating a magnetic field passing through a corresponding coil radially.

Figure 3:
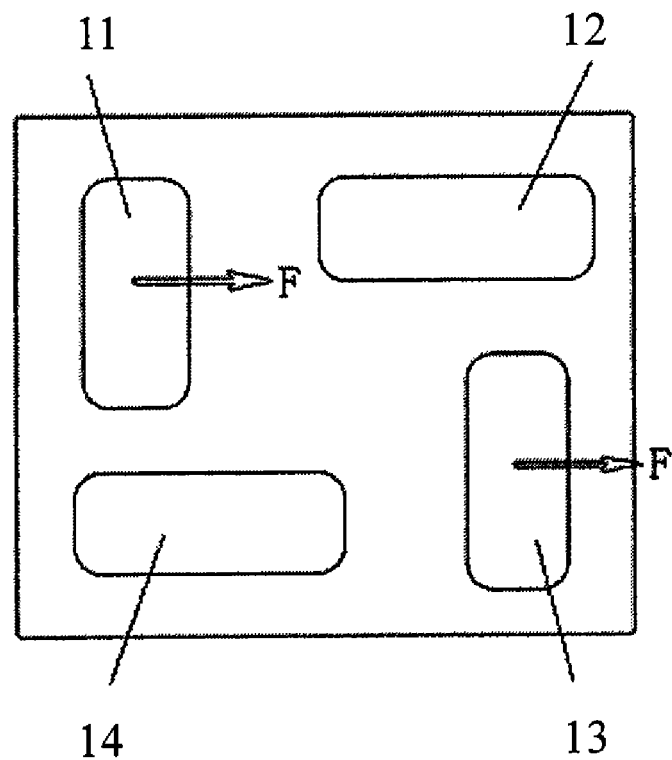
FIG. 3 is a schematic view showing the principle of the micro stage for obtaining a motion in X direction.
Figure 4:
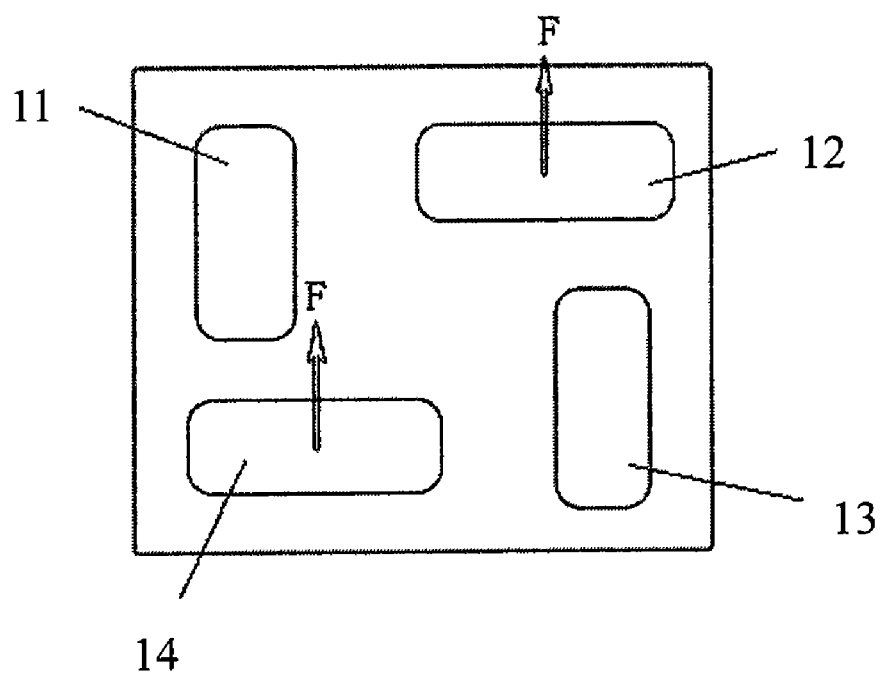
FIG. 4 is a schematic view showing the principle of the micro stage for obtaining a motion in Y direction
Figure 5:
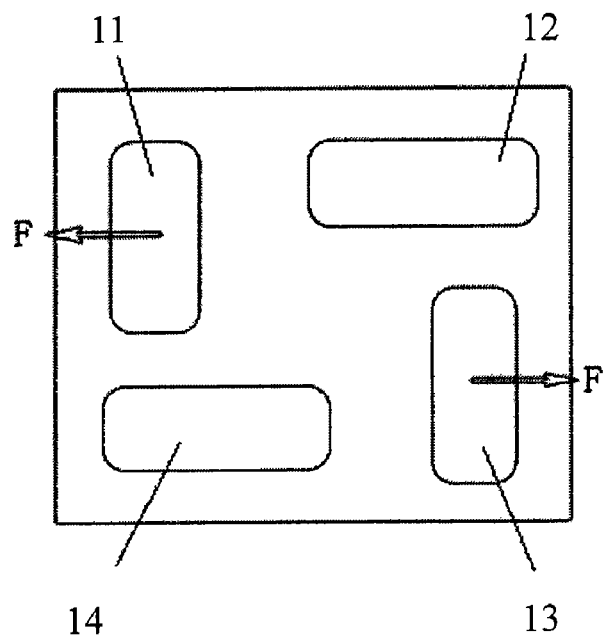
FIG. 5 is a schematic view showing the principle of the micro stage for obtaining a rotation around Z axis.

As shown in FIGS. 3 to 5, the micro stage operates in accordance to Lorentz Law. Three directions, i.e., the direction of the magnetic fields generated by the permanent magnets of the horizontally arranged driving units, the direction of the electrical currents flowing in the coils which are disposed in the micro stage stator, and the direction of the generated Lorentz force, are perpendicular to each other. When only the first horizontally arranged driving unit 11 and the third horizontally arranged driving unit 13 are energized with electrical currents, the driving units generate Lorentz forces in X direction and thus the micro stage mover moves in X direction. When only the second horizontally arranged driving unit 12 and the fourth horizontally arranged driving unit 14 are energized with electrical currents, the driving units generate Lorentz forces in Y direction and thus the micro stage mover moves in Y direction. When the first horizontally arranged driving unit 11 and the third horizontally arranged driving unit 13 are energized with electrical currents flowing in opposite directions, the driving units generate two Lorentz forces in opposite directions and thus the micro stage mover rotates around Z axis.

Figure 6:
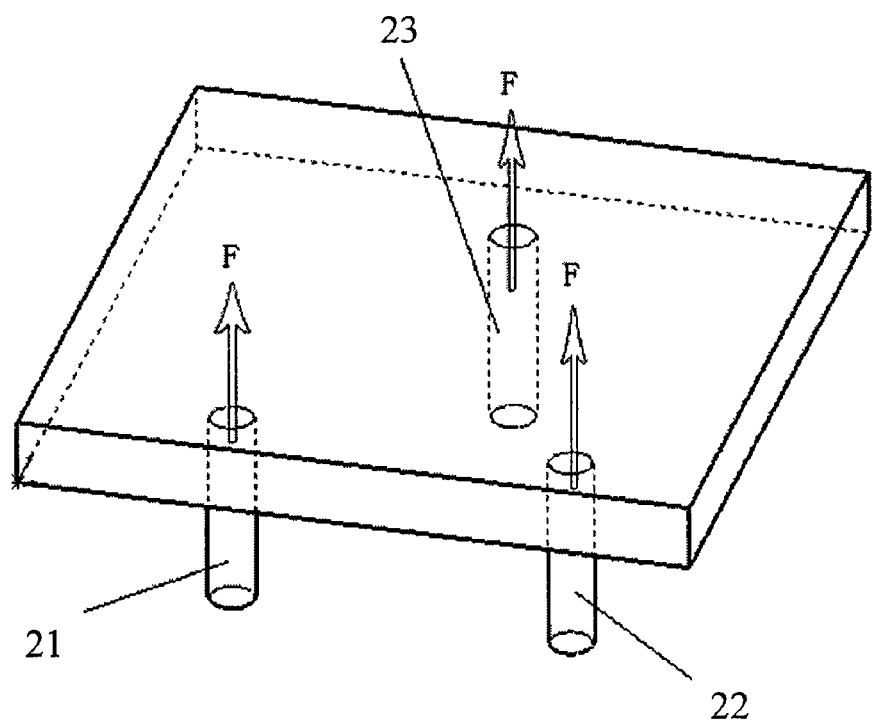
FIG. 6 is a schematic view showing the principle of the micro stage for obtaining a motion in Z direction.
Figure 7:
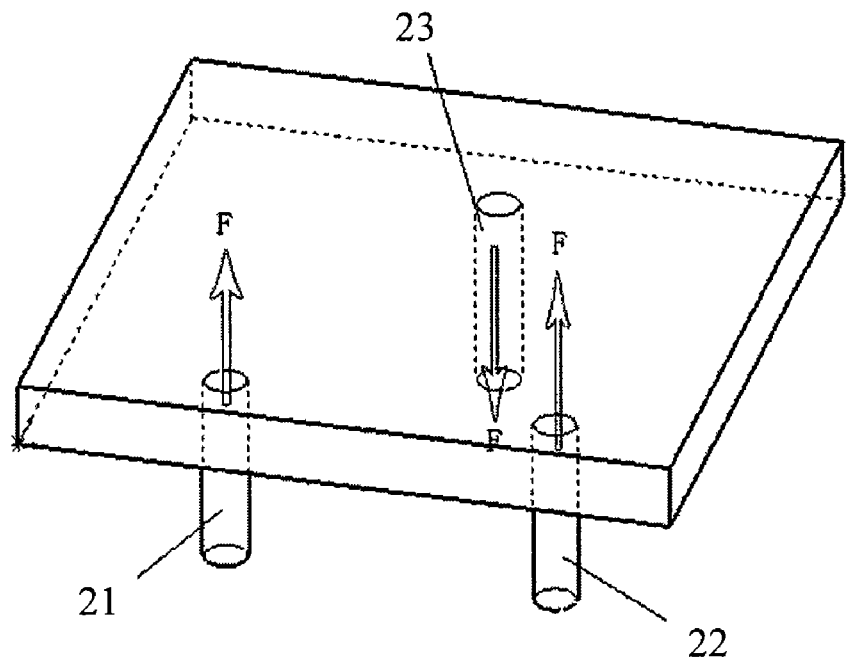
FIG. 7 is a schematic view showing the principle of the micro stage for obtaining a rotation around X axis.
Figure 8:
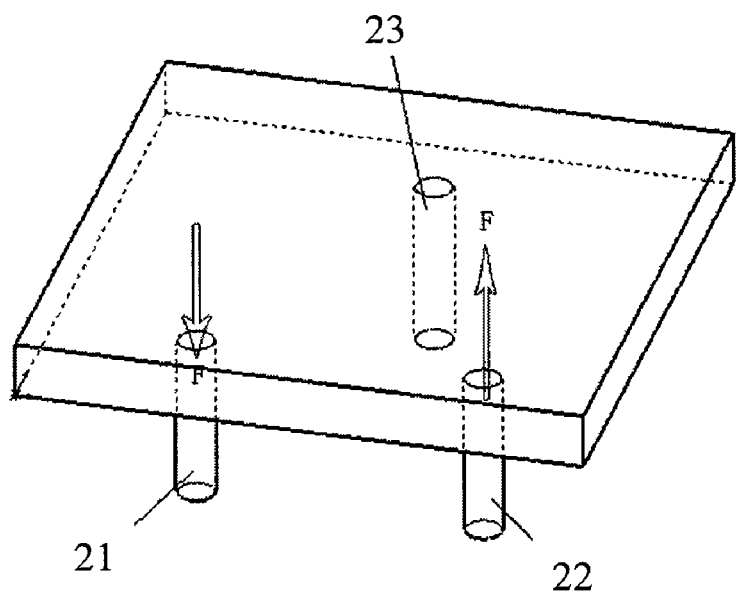
FIG. 8 is a schematic view showing the principle of the micro stage for obtaining a rotation around Y axis.

As shown in FIGS. 6 to 8, the vertically arranged driving units generate Lorentz forces in the vertical direction respectively. When the first vertically arranged driving unit 21, the second vertically arranged driving unit 22 and the third vertically arranged driving unit 23 are all energized with electrical currents, the driving units generate pushing forces in Z direction and thus the micro stage mover moves in Z direction. When the first vertically arranged driving unit 21 and the second vertically arranged driving unit 22 are energized with electrical currents flowing in the same direction and the third vertically arranged driving unit 23 is energized with an electrical current flowing in an opposite direction, the driving units generate a torque around X axis and thus the micro stage mover rotates around X axis. When the first vertically arranged driving unit 21 and the second vertically arranged driving unit 22 are energized with electrical currents flowing in opposite directions and the third vertically arranged driving unit 23 is not energized, the driving units generate a torque around Y axis and thus the micro stage mover rotates around Y axis.

The invention claimed is:

1. A micro stage with 6 degrees of freedom, comprising a micro stage stator, a micro stage mover, and a micro stage base, the micro stage having three sets of electromagnetic driving units arranged in a horizontal plane, with each set comprising at least one electromagnetic driving unit, wherein the driving axes of two of the three sets of driving units are parallel to each other but not coincided, the driving axis of the third set of driving unit is orthogonal to the driving axes of the former two sets of driving units, and the three sets of horizontally arranged driving units are configured to cooperatively obtain movements of the micro stage within the horizontal plane with 3 degrees of freedom in X, Y and $\theta_z$ directions, characterized in that the micro stage further has three electromagnetic driving units arranged in a vertical direction and disposed in a triangular layout, for driving the micro stage to obtain additional movements with 3 degrees of freedom in Z, $\theta_x$ and $\theta_y$ directions, wherein each of the horizontally arranged driving units is composed of two parts, i.e., a planar permanent magnet polarized in the vertical direction and a coil, with the planar permanent magnet being disposed along opposite sides of the effective driving direction of the coil and fixed in the micro stage mover, and the coil being nested in a single-layered coil frame and thereby fixed to the micro stage stator; and each of the vertically arranged electromagnetic driving units is composed of a cylindrical permanent magnet polarized in radial directions and a coil, with the cylindrical permanent magnet being fixed in the micro stage mover and the coil being fixed to the micro stage stator.

* * * * *